US012671336B2

(12) United States Patent
Oku

(10) Patent No.: US 12,671,336 B2
(45) Date of Patent: Jun. 30, 2026

(54) POWER SUPPLY CONTROLLER

(71) Applicant: ROHM CO., LTD., Kyoto (JP)

(72) Inventor: Hironori Oku, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 18/746,836

(22) Filed: Jun. 18, 2024

(65) Prior Publication Data

US 2024/0429822 A1 Dec. 26, 2024

(30) Foreign Application Priority Data

Jun. 21, 2023 (JP) ................................. 2023-101693

(51) Int. Cl.
| | |
|---|---|
| *H02M 3/158* | (2006.01) |
| *G05F 1/56* | (2006.01) |
| *G06F 1/26* | (2006.01) |
| *G06F 1/28* | (2006.01) |
| *G11C 11/4074* | (2006.01) |
| *G11C 16/30* | (2006.01) |

(52) U.S. Cl.
CPC .............. *H02M 3/158* (2013.01); *G05F 1/56* (2013.01); *G06F 1/26* (2013.01); *G06F 1/28* (2013.01); *G11C 11/4074* (2013.01); *G11C 16/30* (2013.01)

(58) Field of Classification Search
CPC .... G11C 16/30; G11C 11/4074; H02M 1/327; H02M 3/158; G06F 1/26; G06F 1/28; G05F 1/56
See application file for complete search history.

(56) References Cited

U.S. PATENT DOCUMENTS

| | | | | |
|---|---|---|---|---|
| 2013/0073257 A1* | 3/2013 | Williams | ........... | G01R 31/3274 |
| | | | | 702/179 |
| 2017/0371661 A1* | 12/2017 | Sparling | ................... | G06F 1/28 |
| 2019/0012846 A1* | 1/2019 | Tonet | ...................... | G07C 3/00 |
| 2024/0048039 A1* | 2/2024 | Yamada | ............... | H02M 1/008 |

FOREIGN PATENT DOCUMENTS

JP          2020-089043          6/2020

* cited by examiner

*Primary Examiner* — Ryan Johnson
(74) *Attorney, Agent, or Firm* — Fish & Richardson P.C.

(57) ABSTRACT

A power supply controller controls operation of a power supply apparatus that generates an output voltage from an input voltage. The power supply controller includes a temperature determination circuit configured to determine to which of a plurality of temperature ranges a temperature of the power supply controller belongs, a measurement circuit configured to measure, for each of the plurality of temperature ranges, a period for which the temperature of the power supply controller belongs to the temperature range, and a nonvolatile memory configured to store a measurement result of the measurement circuit.

9 Claims, 7 Drawing Sheets

FIG.9

TEMPERATURE HISTORY INFORMATION

| TEMPERATURE RANGE | CUMULATIVE DRIVE TIME |
|---|---|
| $R[m]$ | $t_{ACM}[m]$ ($N_{ACM}[m]$) |
| $R[m-1]$ | $t_{ACM}[m-1]$ ($N_{ACM}[m-1]$) |
| $\vdots$ | $\vdots$ |
| $R[3]$ | $t_{ACM}[3]$ ($N_{ACM}[3]$) |
| $R[2]$ | $t_{ACM}[2]$ ($N_{ACM}[2]$) |
| $R[1]$ | $t_{ACM}[1]$ ($N_{ACM}[1]$) |

FIG.10

| TEMPERATURE RANGE | | CUMULATIVE DRIVE TIME | |
|---|---|---|---|
| $R[5]$ | EQUAL TO OR MORE THAN 125°C | $t_{ACM}[5]$ | 1 HOUR |
| $R[4]$ | 100°C TO LESS THAN 125°C | $t_{ACM}[4]$ | 5 HOURS |
| $R[3]$ | 75°C TO LESS THAN 100°C | $t_{ACM}[3]$ | 10 HOURS |
| $R[2]$ | 0°C TO LESS THAN 75°C | $t_{ACM}[2]$ | 200 HOURS |
| $R[1]$ | LESS THAN 0°C | $t_{ACM}[1]$ | 1 HOUR |

POWER SUPPLY CONTROLLER

CROSS-REFERENCE TO RELATED APPLICATIONS

This nonprovisional application claims priority under 35 U.S.C. § 119(a) on Patent Application No. 2023-101693 filed in Japan on Jun. 21, 2023, the entire contents of which are hereby incorporated by reference.

TECHNICAL FIELD

The present disclosure relates to a power supply controller.

BACKGROUND ART

Various types of power supply controllers are in practical use as a device that controls the operation of a power supply apparatus that generates an output voltage from an input voltage.

CITATION LIST

Patent Literature

Patent Literature 1: JP 2020-089043 A

DESCRIPTION OF THE DRAWINGS

FIG. 9 is a structural diagram showing temperature history information stored in a nonvolatile memory according to the embodiment of the present disclosure.

FIG. 10 is a diagram showing an example of the temperature history information stored in the nonvolatile memory according to the embodiment of the present disclosure.

DETAILED DESCRIPTION OF PREFERRED EMBODIMENTS

Examples of embodiments of the present disclosure will be described in detail below with reference to the drawings.

In each of the referenced figures, the same parts are denoted by the same reference signs, and duplicate descriptions of identical parts will be omitted in principle. Herein, to facilitate description, the symbols or reference signs referring to information, signals, physical quantities, functional parts, circuits, elements, or components may be described, and the names of the information, signals, physical quantities, functional parts, circuits, elements, or components corresponding to these symbols or reference signs may be omitted or abbreviated. For example, a nonvolatile memory referred to by "26" below (see FIG. 6) may be described as "nonvolatile memory 26" or abbreviated to "memory 26," and both these terms refer to the same thing.

First, an explanation is provided for some terms used in the description of the embodiments of the present disclosure. The term "ground" refers to a reference conductive part having a reference potential of 0 V (zero volts) or the 0 V potential itself. The reference conductive part may be formed using a conductor such as metal. In the embodiments of the present disclosure, voltage indicated without any particular reference represents potential as seen from ground.

For any transistor configured as an FET (field-effect transistor), which can be a MOSFET, "on state" refers to a state where the transistor is conducting between its drain and source, and "off state" refers to a state where the transistor is not conducting (is cut off) between its drain and source. The same applies to transistors not classified as FETs. The MOSFET should be regarded as an enhancement-mode MOSFET unless otherwise specified. MOSFET is an abbreviation for "metal-oxide-semiconductor field-effect transistor." Unless otherwise stated, the back gate of a MOSFET is considered to be short-circuited to the source. Hereafter, the on-state and off-state of any transistor may be simply referred to as "on" or "off."

Connections between the multiple sites forming a circuit, such as circuit elements, wires, or nodes, may be understood as referring to an electrical connection, unless otherwise stated.

Figure 1:
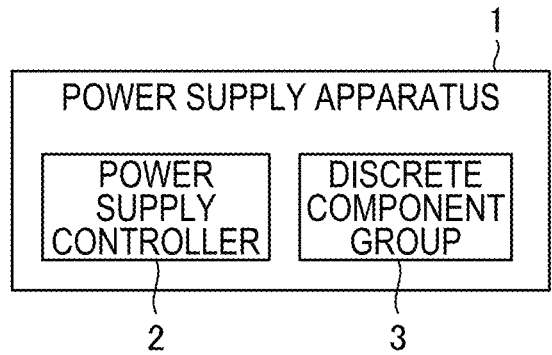
FIG. 1 is a schematic configuration block diagram of a power supply apparatus according to an embodiment of the present disclosure.

FIG. 1 is a schematic configuration block diagram of a power supply apparatus 1 according to an embodiment of the present disclosure. The power supply apparatus 1 includes a power supply controller 2 and a discrete component group 3 consisting of a plurality of discrete components that are externally connected to the power supply controller 2. The power supply controller 2 may be an electronic component classified as a PMIC (power management IC).

Figure 2:
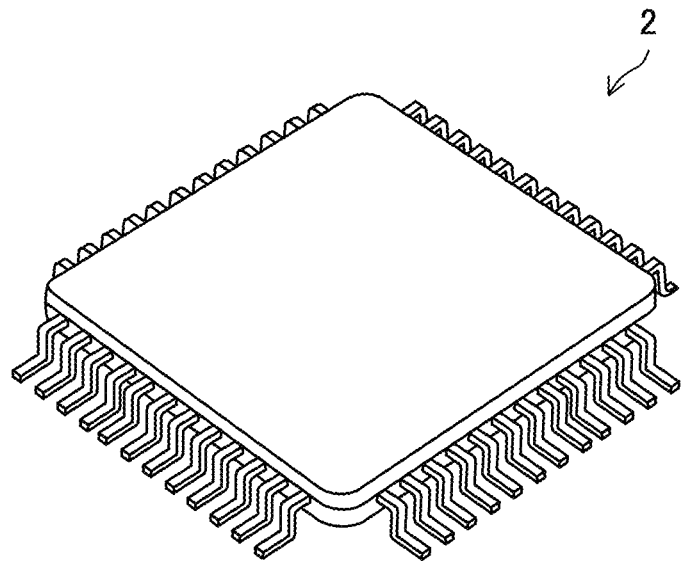
FIG. 2 is an external perspective view of a power supply controller according to the embodiment of the present disclosure.

FIG. 2 is an external perspective view of the power supply controller 2. The power supply controller 2 is an electronic component including a semiconductor chip with a semiconductor integrated circuit formed on a semiconductor substrate, a housing (package) accommodating the semiconductor chip, and a plurality of external terminals that are exposed from the housing to the outside of the power supply controller 2. The power supply controller 2 is formed by enclosing the semiconductor chip in the housing (package), which is made of resin. Note that the number of external terminals of the power supply controller 2 and the type of housing of the power supply controller 2 illustrated in FIG. 2 are merely examples, and the external terminals and housing can be given any design.

Figure 3:
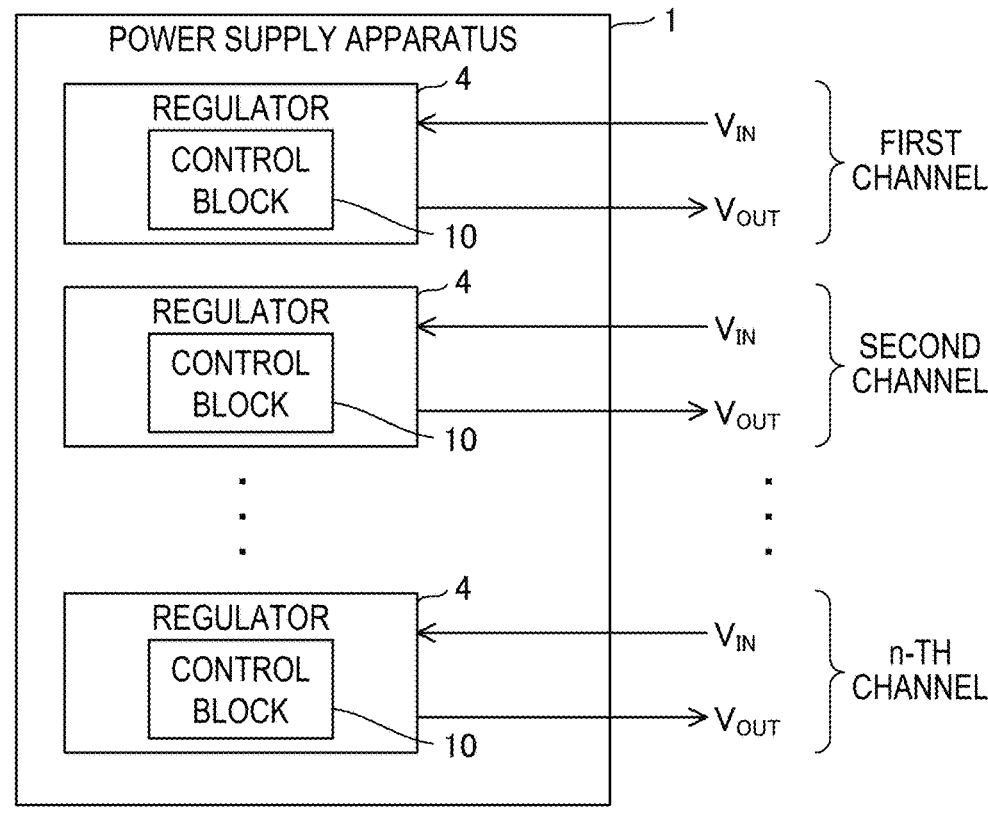
FIG. 3 illustrates the power supply apparatus according to the embodiment of the present disclosure provided with a plurality of regulators for a plurality of channels.

As illustrated in FIG. 3, the power supply apparatus 1 includes regulators 4 in a number corresponding to n channels, that is, n number of regulators 4 are provided. Each regulator 4 is provided with a control block 10. The n is any integer equal to or greater than 2. The n channels comprise first to n-th channels. Each regulator 4 receives supply of an input voltage $V_{IN}$ and generates an output voltage $V_{OUT}$ by power converting the input voltage $V_{IN}$. In each channel, the input voltage $V_{IN}$ and the output voltage $V_{OUT}$ are DC voltages different from each other. The input voltage $V_{IN}$ or the output voltage $V_{OUT}$ in each channel may be a negative DC voltage. However, in the following description, the input voltage $V_{IN}$ and the output voltage $V_{OUT}$ in each channel are positive DC voltages.

The regulators 4 for one or more channels of the first to n-th channels may each be a switching regulator. The regulator 4 as a switching regulator can be a buck switching regulator that generates an output voltage $V_{OUT}$ lower than the input voltage $V_{IN}$ by bucking the input voltage $V_{IN}$, or a boost switching regulator that generates an output voltage $V_{OUT}$ higher than the input voltage $V_{IN}$ by boosting the input voltage $V_{IN}$. The regulators 4 for one or more channels of the first to n-th channels may each be a linear regulator. All of the n regulators 4 for the first to n-th channels may all be switching regulators or may all be linear regulators. One or more switching regulators and one or more linear regulators may be mixed among the total number of n regulators 4 for the first to n-th channels.

The total number of n output voltages $V_{OUT}$ in the first to n-th channels are different DC voltages from each other. However, the value of the output voltage $V_{OUT}$ in an $i_A$ channel may coincide with the value of the output voltage $V_{OUT}$ in an is channel, where $i_A$ and $i_B$ represent any natural numbers that differ from each other and are equal to or less than n.

The total number of n input voltages $V_{IN}$ in the first to n-th channels may be the same DC voltage as each other. That is, a common DC voltage can be used as the input voltage $V_{IN}$ in the first to n-th channels. The input voltage $V_{IN}$ in the $i_A$ channel can be the same as or different from the input voltage $V_{IN}$ in the $i_B$ channel. The input voltage $V_{IN}$ in any of the first to n-th channels may be the power supply voltage of the power supply controller 2.

Figure 4:
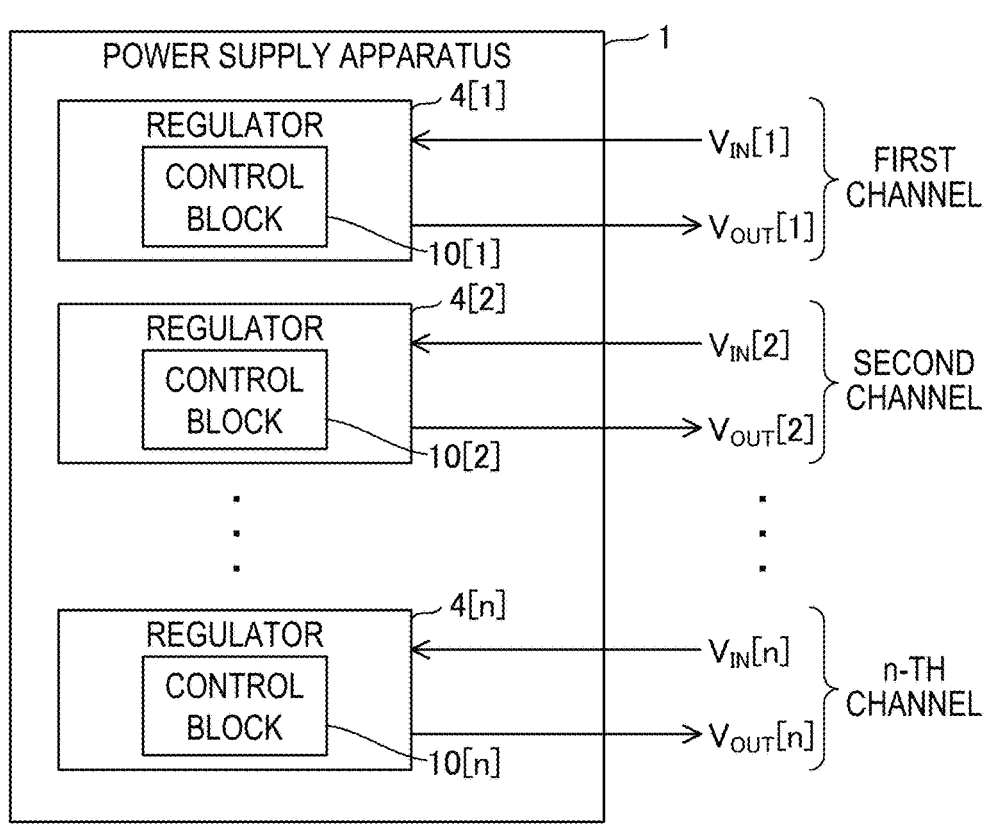
FIG. 4 illustrates the power supply apparatus according to the embodiment of the present disclosure provided with a plurality of regulators for a plurality of channels.

The total number of n control blocks 10 in the first to n-th channels are provided in the power supply controller 2. In each channel, the regulator 4 is formed by the control block 10 and discrete components connected to the control block 10. As illustrated in FIG. 4, the regulator 4, the control block 10, the input voltage $V_{IN}$, and the output voltage $V_{OUT}$ in the i-th channel are denoted as a regulator 4[*i*], a control block 10[*i*], an input voltage $V_{IN}$[i], and an output voltage $V_{OUT}$[i], respectively, where i is any integer (e.g., any natural number equal to or less than n).

The power supply apparatus 1 operates (performs power conversion) to generate the output voltage $V_{OUT}$ from the input voltage $V_{IN}$ for each channel. The power supply controller 2 controls the operation (power conversion) of the power supply apparatus 1. That is, the power controller 2 controls the operation (power conversion) of the regulator 4 for each channel.

Figure 5:
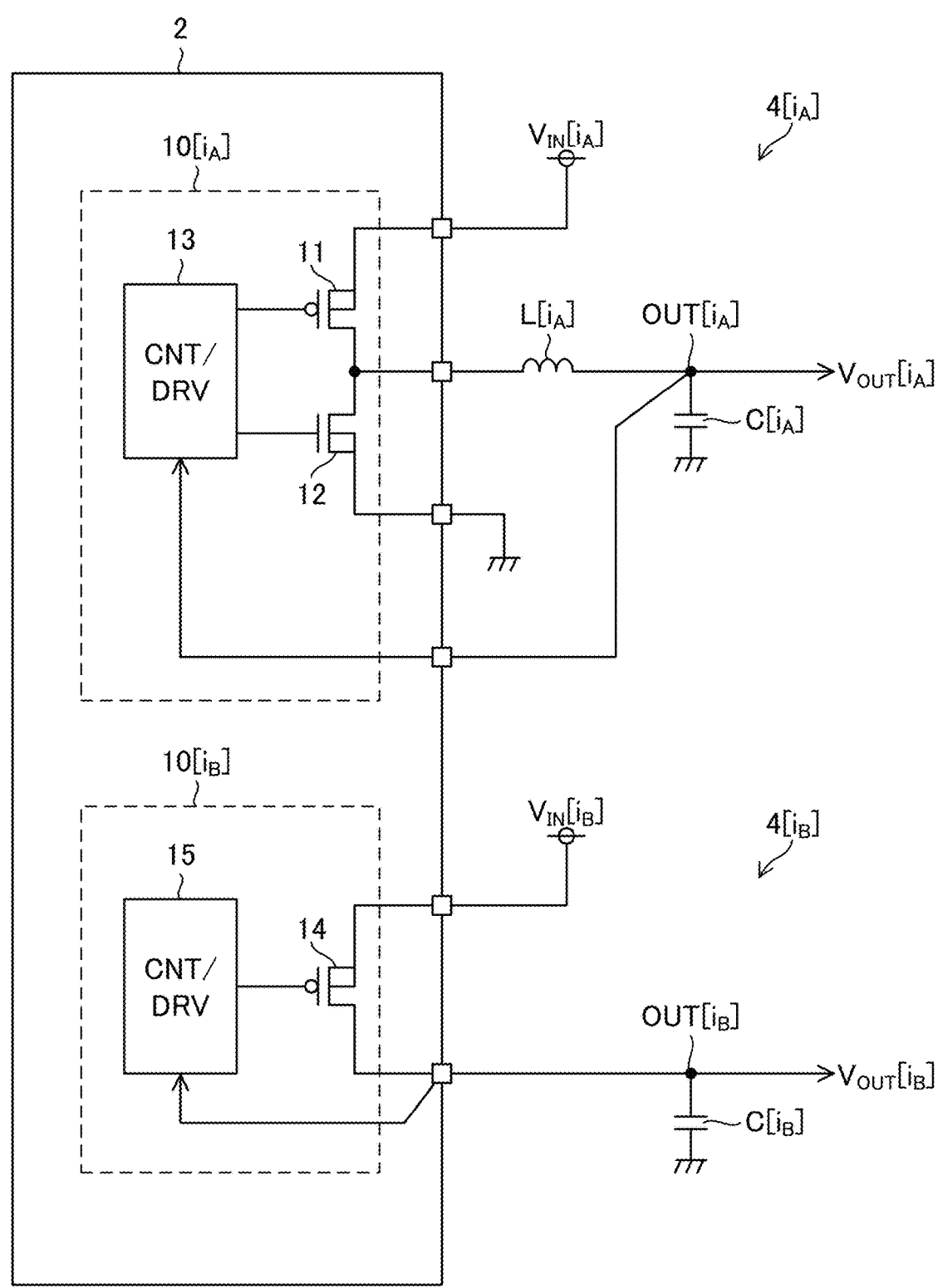
FIG. 5 is a configuration diagram of two regulators in the power supply apparatus according to the embodiment of the present disclosure.

FIG. 5 illustrates an example configuration of regulators 4[$i_A$] and 4[$i_B$], which are any two of regulators 4[1] to 4[*n*]. The regulator 4[$i_A$] is a buck switching regulator including a control block 10[$i_A$], an output coil L[$i_A$] and an output capacitor C[$i_A$]. The regulator 4[$i_B$] is a linear regulator including a control block 10[$i_B$] and an output capacitor C[$i_B$]. The regulator 4[$i_B$] may be an LDO (Low Dropout) regulator. The control blocks 10[$i_A$] and 10[$i_B$] are provided in the power supply controller 2. The output coil L[$i_A$] and the output capacitors C[$i_A$] and C[$i_B$] are components of the discrete component group 3 (see FIG. 1).

The control block 10[$i_A$] includes transistors 11 and 12 and a control drive circuit 13. The transistor 11 is a P-channel MOSFET and the transistor 12 is an N-channel MOS-FET. The input voltage $V_{IN}$ [$i_A$] is supplied to the source of the transistor 11. The drains of the transistors 11 and 12 are connected in common to a first end of the output coil L[$i_A$]. The second end of the output coil L[$i_A$] is connected to an output node OUT[A]. The source of the transistor 12 is connected to ground. The output capacitor C[$i_A$] is provided between the output node OUT[A] and ground. That is, the first end of the output capacitor C[i] is connected to the output node OUT[$i_A$] and the second end of the output capacitor C[$i_A$] is connected to ground. The voltage at the output node OUT[$i_A$] is an output voltage $V_{OUT}$[$i_A$].

Feedback information of the output voltage $V_{OUT}$[$i_A$] is input to the control drive circuit 13. In FIG. 5, since the output node OUT[$i_A$] is connected to the control drive circuit 13, the output voltage $V_{OUT}$[$i_A$] itself is input to the control drive circuit 13 as the feedback information of the output voltage $V_{OUT}$[$i_A$]. However, the feedback information of the output voltage $V_{OUT}$[$i_A$] may be a divisional voltage of the output voltage $V_{OUT}$[$i_A$]. The control drive circuit 13 is connected to each gate of the transistors 11 and 12 and individually controls the transistors 11 and 12 to on or off by controlling each gate potential of the transistors 11 and 12. The control drive circuit 13 performs switching control to alternately switch the transistors 11 and 12 between on and off so that, based on the feedback information of the output voltage $V_{OUT}$[$i_A$], the output voltage $V_{OUT}$[$i_A$] is stabilized at a predetermined target voltage. Due to this switching control, a rectangular voltage (a rectangular voltage that fluctuates between approximately 0 V and the input voltage $V_{IN}$ [$i_A$]) is generated at a connection node between the transistors 11 and 12. The output coil L[$i_A$] and the output capacitor C[$i_A$] rectify and smooth this rectangular voltage to produce the output voltage $V_{OUT}$[$i_A$] at the output node OUT[$i_A$].

The control block 10[$i_B$] includes a transistor 14 and a control drive circuit 15. The transistor 14 is a P-channel MOSFET. An input voltage $V_{IN}$ [$i_B$] is supplied to the source of the transistor 14. The drain of the transistor 14 is connected to an output node OUT[$i_B$]. An output capacitor C[$i_B$] is provided between the output node OUT[$i_B$] and ground. That is, a first end of the output capacitor C[is] is connected to the output node OUT[$i_B$] and a second end of the output capacitor C[$i_B$] is connected to ground. The voltage at the output node OUT[$i_B$] is an output voltage $V_{OUT}$[$i_B$].

Feedback information of the output voltage $V_{OUT}$[$i_B$] is input to the control drive circuit 15. In FIG. 5, since the output node OUT[$i_B$] is connected to the control drive circuit 15, the output voltage $V_{OUT}$[$i_B$] itself is input to the control drive circuit 15 as the feedback information of the output voltage $V_{OUT}$[$i_B$]. However, the feedback information of the output voltage $V_{OUT}$[$i_B$] may be a divisional voltage of the output voltage $V_{OUT}$[$i_B$]. The control drive circuit 15 is connected to the gate of the transistor 14. The control drive circuit 15 controls the gate potential of the transistor 14 based on the feedback information of the output voltage $V_{OUT}$[$i_B$], thereby controlling the magnitude of current supplied to the output node OUT[$i_B$] via the transistor 14. This control stabilizes the output voltage $V_{OUT}$[$i_B$] at a predetermined target voltage.

Two or more regulators 4 each having a configuration equivalent to that of the regulator 4[$i_A$] may be provided in the power supply apparatus 1. Two or more regulators 4 each having a configuration equivalent to that of the regulator 4[$i_B$] may be provided in the power supply apparatus 1.

Figure 6:
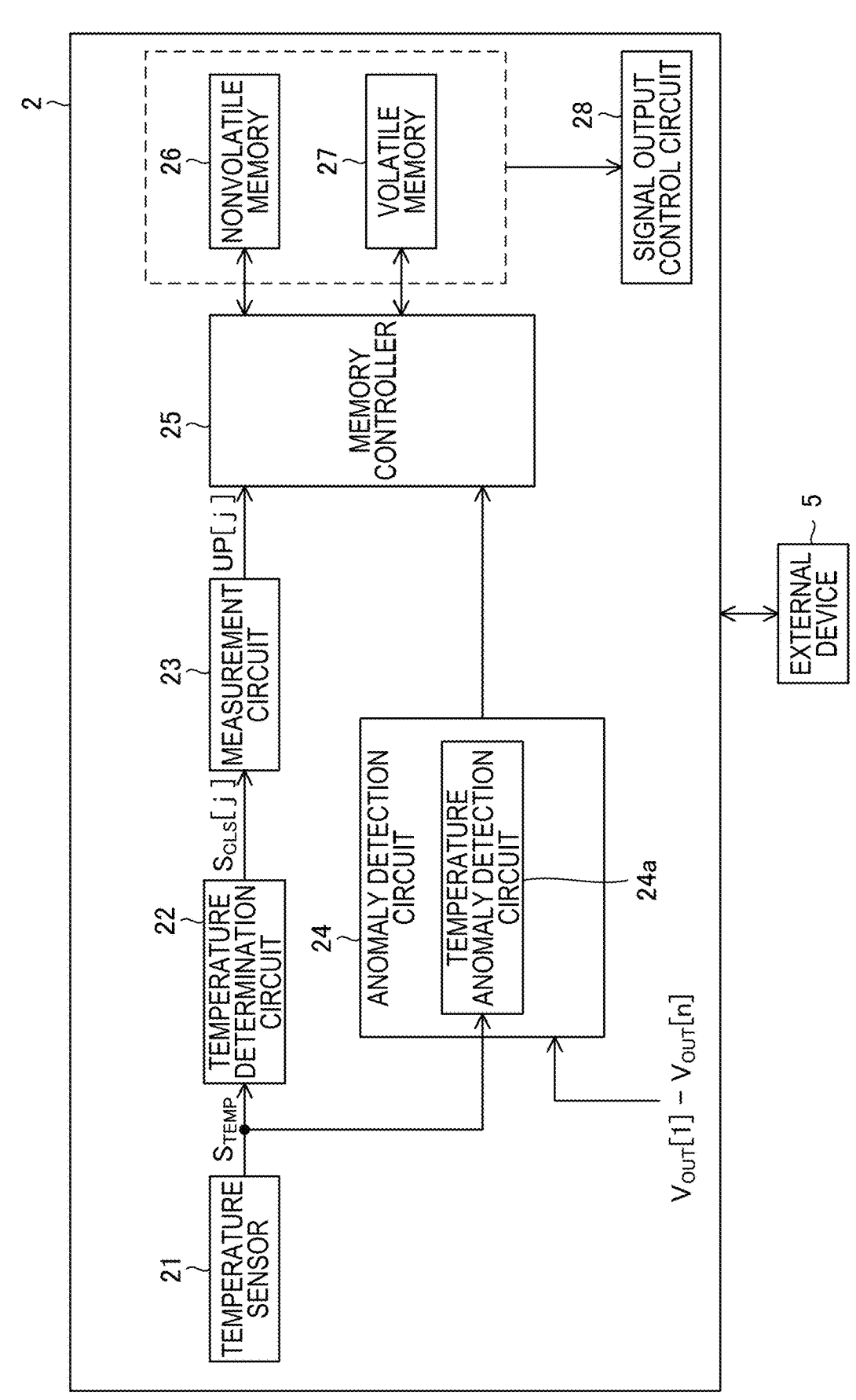
FIG. 6 is a partial block diagram of the power supply controller according to the embodiment of the present disclosure.

FIG. 6 is a block diagram illustrating a part of the power supply controller 2 to illustrate how the characteristic functions of the power supply controller 2 are exhibited. The power supply controller 2 includes a temperature sensor 21, a temperature determination circuit 22, a measurement circuit 23, an anomaly detection circuit 24, a memory controller 25, a nonvolatile memory 26, a volatile memory 27, and a signal output control circuit 28. The anomaly detection circuit 24 includes a temperature anomaly detection circuit 24a. FIG. 6 also illustrates an external device 5 provided outside the power supply controller 2. The external device 5 includes, for example, an MPU (micro processing unit). The power supply controller 2 and the external device 5 are connected to each other via a predetermined communication bus to enable bidirectional communication. For example, bidirectional communication between the power supply controller 2 and the external device 5 is realized via a communication bus such as an I²C (Inter-Integrated Circuit) bus or an SPI (serial peripheral interface) bus.

The temperature sensor 21 detects a target temperature TEMP and outputs a temperature signal $S_{TEMP}$ corresponding to the target temperature TEMP. The target temperature TEMP is the temperature of the power supply controller 2. More specifically, the target temperature TEMP is the temperature at a predetermined measurement target position in the power supply controller 2. That is, the temperature sensor 21 is installed at a predetermined measurement target position in the power supply controller 2 and outputs the temperature signal $S_{TEMP}$ corresponding to the temperature at the measurement target position.

The temperature sensor 21 generates the temperature signal $S_{TEMP}$ by using a temperature detection diode formed by a semiconductor PN junction. More specifically, for example, the temperature sensor 21 includes the temperature detection diode, a constant-current circuit that supplies a constant current to the temperature detection diode in the forward direction, and an output circuit that generates the temperature signal $S_{TEMP}$ based on a forward voltage Vf of the temperature detection diode (none illustrated in the drawings). The forward voltage Vf is a forward voltage generated by the temperature detection diode during a period when the constant current is supplied to the temperature detection diode in the forward direction. The temperature signal $S_{TEMP}$ may be the forward voltage Vf itself or a signal obtained by amplifying the forward voltage Vf. The temperature signal $S_{TEMP}$ can be generated through detection of the forward voltage Vf because the forward voltage Vf increases or decreases depending on the target temperature TEMP. The temperature signal $S_{TEMP}$ is supplied to the temperature determination circuit 22 and the temperature anomaly detection circuit 24a.

Figure 7:
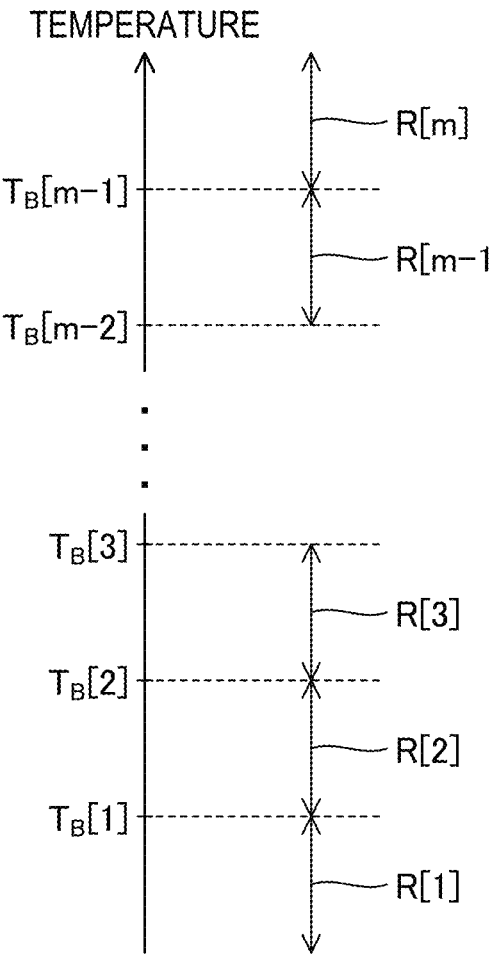
FIG. 7 is a diagram showing the relationship between multiple boundary temperatures and multiple temperature ranges according to the embodiment of the present disclosure.

The temperature determination circuit 22 determines to which of a temperature range R[1] to a temperature range R[m] the target temperature TEMP belongs based on the temperature signal $S_{TEMP}$, where m is any integer equal to or greater than 2. The temperature ranges R[1] to R[m] are m types of temperature ranges that do not overlap each other. Sec FIG. 7. In the temperature determination circuit 22, boundary temperatures $T_B[1]$ to $T_B[m-1]$, which are a predetermined number (m−1) of types of temperatures, are defined. A boundary temperature $T_B[j+1]$ is higher than a boundary temperature $T_B[j]$, where j is any integer. For any integer j satisfying "$2 \leq j \leq m-1$," the temperature range R[j] is equal to or greater than a boundary temperature $T_B[j-1]$ and less than the boundary temperature $T_B[j]$. Temperatures below the boundary temperature $T_B[1]$ belong to the temperature range R[1]. Temperatures equal to or greater than a boundary temperature $T_B[m]$ belong to the temperature range R[m].

The temperature determination circuit 22 may be configured by an AD converter. In this case, the AD converter acquires a voltage value of the temperature signal $S_{TEMP}$ by converting the temperature signal $S_{TEMP}$, which is an analog voltage signal, into a digital signal. Then, based on the acquired voltage value, the temperature determination circuit 22 determines to which of the temperature ranges R[1] to R[m] the target temperature TEMP belongs. Alternatively, the temperature determination circuit 22 may be configured by (m−1) comparators. In this case, the temperature determination circuit 22 compares the voltage of the temperature signal $S_{TEMP}$ with (m−1) types of determination voltages using the (m−1) comparators, and determines to which of the temperature ranges R[1] to R[m] the target temperature TEMP belongs based on the high/low relationship between the voltage of the temperature signal $S_{TEMP}$ and the (m−1) types of determination voltages.

A classification signal $S_{CLS}$ indicating to which of the temperature ranges R[1] to R[m] the target temperature TEMP belongs is output from the temperature determination circuit 22 to the measurement circuit 23.

Based on the classification signal $S_{CLS}$, the measurement circuit 23 measures, for each temperature range, the period for which the temperature TEMP belongs to that temperature range. For convenience, the classification signal $S_{CLS}$ indicating that the target temperature TEMP belongs to the temperature range R[j] is referred to as a classification signal $S_{CLS}[j]$. Thus, for example, during the period for which the target temperature TEMP belongs to the temperature range R[1], a classification signal $S_{CLS}[1]$ is output from the temperature determination circuit 22 to the measurement circuit 23, and during the period for which the target temperature TEMP belongs to the temperature range R[2], a classification signal $S_{CLS}[2]$ is output from the temperature determination circuit 22 to the measurement circuit 23. The same applies to the periods for which the target temperature TEMP belongs to the other temperature ranges. The measurement circuit 23 can be configured by a counter. The count value for measuring the period for which the target temperature TEMP belongs to the temperature range R[j] is referred to as a count value VAL[j]. The initial value of the count value VAL[j] is zero.

Figure 8:
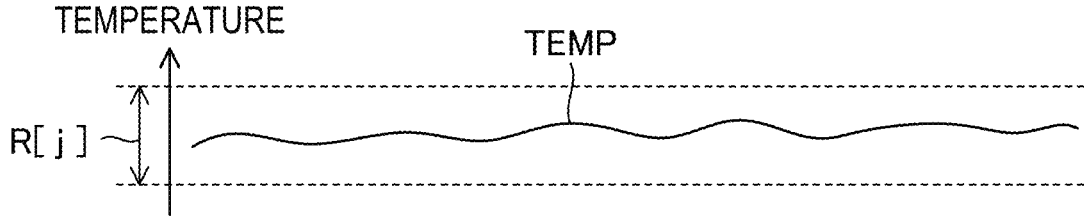
FIG. 8 is a diagram showing operation of the measurement circuit in FIG. 6 according to the embodiment of the present disclosure.
Figure 8:
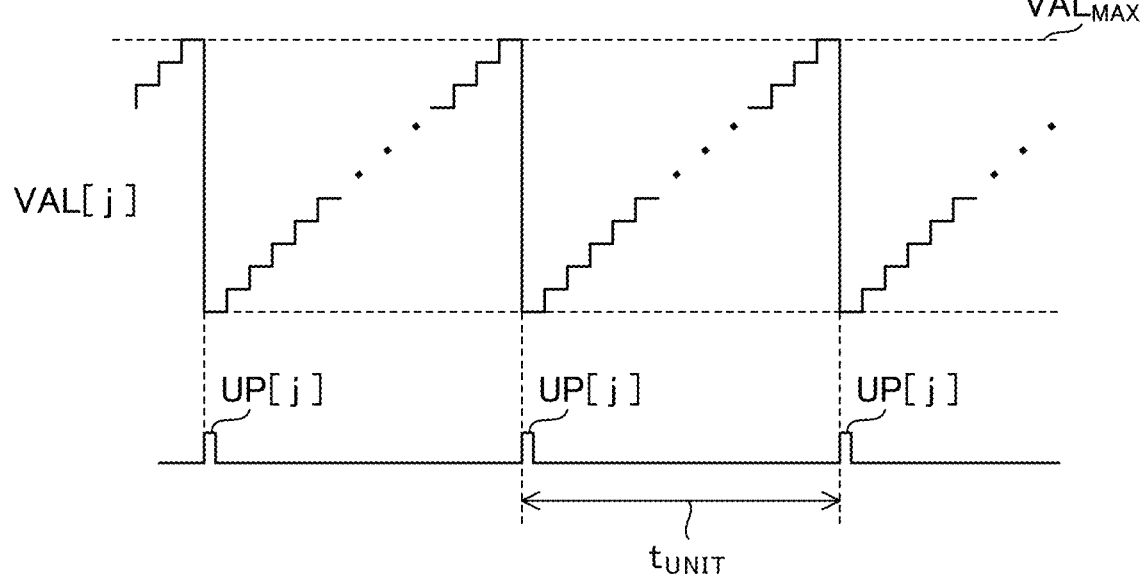

FIG. 8 shows how the count VAL[j] changes during the period for which the target temperature TEMP belongs to the temperature range R[j]. The measurement circuit 23 adds 1 to the count value VAL[j] each time a predetermined increment in time elapses during the period in which the classification signal $S_{CLS}[j]$ is supplied to itself (that is, the period for which the target temperature TEMP belongs to the temperature range R[j]). When the count value VAL[j] reaches a predetermined upper limit value $VAL_{MAX}$, the measurement circuit 23 resets the count value VAL[j] and outputs a count-up signal UP[j] to the memory controller 25. Then, during the period for which the target temperature TEMP belongs to the temperature range R[j], the count-up signal UP[j] is output to the memory controller 25 each time a unit time $t_{UNIT}$ elapses. That is, for example, during the period for which the target temperature TEMP belongs to the temperature range R[1], an count-up signal UP[1] is output from the measurement circuit 23 to the memory controller 25 each time the unit time $t_{UNIT}$ elapses, and during the period for which the target temperature TEMP belongs to the temperature range R[2], an count-up signal UP[2] is output from the measurement circuit 23 to the memory controller 25 each time the unit time $t_{UNIT}$ elapses. The same applies to the periods for which the target temperature TEMP belongs to the other temperature ranges. The unit time $t_{UNIT}$ corresponds to the product of the above-mentioned increment in time and the upper limit value $VAL_{MAX}$ and is, for example, several minutes to several hours. The count-up signal UP[j] may be a one-shot pulse signal, for example.

Note that, resetting the count value VAL[j] means assigning an initial value of zero to the count value VAL[j]. The upper limit value $VAL_{MAX}$ is an integer value that is sufficiently greater than zero (e.g., has a value of 255 or 65535).

The anomaly detection circuit 24 detects a predetermined anomaly (more specifically, detects occurrence or non-occurrence of a predetermined anomaly). The anomaly detected by the anomaly detection circuit 24 is an anomaly in the power supply controller 2 or the power supply apparatus 1. The anomaly to be detected by the anomaly detection circuit 24 includes at least a temperature anomaly. The temperature anomaly detection circuit 24a detects the temperature anomaly. The temperature anomaly includes a first temperature anomaly where the target temperature TEMP reaches a predetermined shutdown temperature $T_{TSD}$ and a second temperature anomaly where the target temperature TEMP reaches a predetermined warning temperature $T_{TW}$ ($T_{TSD}>T_{TW}$). The temperature anomaly detection circuit 24a detects the first or second temperature anomaly based on the temperature signal $S_{TEMP}$ (more specifically, detects occurrence or non-occurrence of the first or second temperature anomaly).

The anomaly to be detected by the anomaly detection circuit 24 includes an output voltage anomaly for each channel. The anomaly detection circuit 24 detects an output voltage anomaly of the i-th channel based on the feedback information of the output voltage $V_{OUT}[i]$. The feedback information of the output voltage $V_{OUT}[i]$ is the output voltage $V_{OUT}[i]$ itself or a divisional voltage of the output voltage $V_{OUT}[i]$. The output voltage anomaly for each channel includes an OVP anomaly, an OVD anomaly, a UVP anomaly, and a UVD anomaly. The OVP anomaly of the i-th channel refers to a state in which the output voltage $V_{OUT}[i]$ is equal to or greater than a predetermined upward protection voltage $V_{OUT}[i]$. The OVD anomaly of the i-th channel refers to a state in which the output voltage $V_{OUT}[i]$ is equal to or greater than a predetermined upward detection voltage $V_{OVD}[i]$. The UVD anomaly of the i-th channel refers to a state in which the output voltage $V_{OUT}[i]$ is equal to or less than a predetermined lower warning voltage $V_{UVD}[i]$. The UVP anomaly of the i-th channel refers to a state in which the output voltage $V_{OUT}[i]$ is equal to or less than a predetermined lower protection voltage $V_{UVP}[i]$. Here, "$V_{OVP}[i]>V_{OVD}[i]>V_{TG}[i]>V_{UVD}[i]>V_{UVP}[i]>0$" holds, where $V_{TG}[i]$ represents the target voltage at which the output voltage $V_{OUT}[i]$ should be stabilized.

In addition, the anomaly detection circuit 24 may detect various types of anomalies. Examples of the anomalies to be detected by the anomaly detection circuit 24 include an anomaly where power supply voltage supplied to the power supply controller 2 is too high or too low, an anomaly in communication between the external device 5 and the power supply controller 2, and an anomaly in a watchdog timer used by the external device 5 or another circuit and the power supply controller 2. The anomaly detection circuit 24 outputs a detection result of each anomaly to the memory controller 25.

The memory controller 25 can write any information to the nonvolatile memory 26 and can write any information to the volatile memory 27. In this case, the memory controller 25 can write information corresponding to the measurement results by the measurement circuit 23 or information corresponding to the detection result of each anomaly by the anomaly detection circuit 24 to the memory 26 and/or 27. The memory controller 25 can also read any information stored in the memory 26 and/or 27.

The nonvolatile memory 26 is a multi-time programmable (MTP) memory that can be rewritten multiple times to store information therein. The nonvolatile memory 26 retains stored content even when the supply of power supply voltage to the power supply controller 2 is interrupted. On the other hand, the stored content of the volatile memory 27 is lost when the supply of power supply voltage to the power supply controller 2 is interrupted. The volatile memory 27 is a random-access memory (RAM), and may be a memory classified as a register. The signal output control circuit 28 can output various information based on the storage content of the memory 26 or 27 to the external device 5 via the communication bus described above. The signal output control circuit 28 may read out the storage contents of the memory 26 or 27 via the memory controller 25.

When an anomaly is detected by the anomaly detection circuit 24, the memory controller 25 can store information indicating this detection in the memories 26 and 27, for each type of detected anomaly. For example, when the first temperature anomaly is detected by the temperature anomaly detection circuit 24a, the memory controller 25 stores information indicating that the first temperature anomaly has been detected in the memories 26 and 27. The same applies when the second temperature anomaly is detected. For example, when the OVP anomaly of the first channel is detected by the anomaly detection circuit 24, the memory controller 25 stores information indicating that the OVP anomaly of the first channel is detected in the memories 26 and 27. Similarly, when the OVP anomaly of the second channel is detected by the anomaly detection circuit 24, the memory controller 25 stores information indicating that the OVP anomaly of the second channel is detected in the memories 26 and 27. The same applies when an OVP anomaly of another channel is detected. The same also applies when an OVD anomaly, an UVP anomaly or an UVD anomaly of any other channel is detected. The same also applies when other types of anomalies are detected.

In addition, the memory controller 25 can perform processing of storing temperature history information in the nonvolatile memory 26. FIG. 9 shows the structure of the temperature history information stored in the nonvolatile memory 26. The temperature history information includes information representing cumulative drive times $t_{ACM}[1]$ to $t_{ACM}[m]$.

The power supply controller 2 is driven only during a period in which the power supply voltage is supplied to the power supply controller 2. The cumulative value of the period (time) for which the temperature TEMP belongs to the temperature range R[j] of the period for which the power supply controller 2 is driven corresponds to the cumulative drive time $t_{ACM}[j]$. In other words, for example, a cumulative drive time $t_{ACM}[1]$ is the cumulative value of the period (time) for which the temperature TEMP belongs to the temperature range R[1] in the period for which the power supply controller 2 is driven (more specifically, of the total drive time). Similarly, for example, a cumulative drive time $t_{ACM}[2]$ is the cumulative value of the period (time) for which the temperature TEMP belongs to the temperature range R[2] of the period for which the power supply controller 2 is driven (more specifically, of the total drive time). The same applies to cumulative drive times $t_{ACM}[3]$ to $t_{ACM}[m]$. In other words, the cumulative drive time $t_{ACM}[j]$ represents the sum of the length of period for which the temperature TEMP belongs to the temperature range R[j] in the period for which the power supply controller 2 is driven (more specifically, of the total drive time).

In practice, cumulative drive values $N_{ACM}[1]$ to $N_{ACM}[m]$ respectively indicating the cumulative drive times $t_{ACM}[1]$ to $t_{ACM}[m]$ may be stored separately in the nonvolatile memory 26. The cumulative drive times $t_{ACM}[1]$ to $t_{ACM}[m]$ and the cumulative drive values $N_{ACM}[1]$ to $N_{ACM}[m]$ correspond to each other one-to-one. That is, the cumulative drive value $N_{ACM}[j]$ is information indicating the cumulative drive time $t_{ACM}[j]$. In the power supply controller 2 in the initial state, the cumulative drive values $N_{ACM}[1]$ to $N_{ACM}[m]$ are all zero. The memory controller 25 increases the cumulative drive value $N_{ACM}[j]$ by 1 each time the memory controller 25 receives the count-up signal UP[j] (see FIG. 8) from the measurement circuit 23. In other words, for example, the memory controller 25 increases the accumulated drive value $N_{ACM}[1]$ by 1 each time the memory controller 25 receives the count-up signal UP[1] from the measurement circuit 23, and increases the accumulated drive value $N_{ACM}[2]$ by 1 each time the memory controller 25 receives the count-up signal UP[2] from the measurement circuit 23. The product of the cumulative drive value $N_{ACM}[j]$ and the unit time $t_{UNIT}$ is the cumulative drive time $t_{ACM}[j]$. Storage of the cumulative drive value $N_{ACM}[j]$ and storage of the cumulative drive time $t_{ACM}[j]$ are equivalent to each other.

FIG. 10 shows an example of the temperature history information at a certain time of interest. In the example in FIG. 10, it is assumed that "m=5" and that the boundary temperatures $T_B[1]$, $T_B[2]$, $T_B[3]$ and $T_B[4]$ are 0° C., 75° C., 100° C. and 125° C., respectively. During a period from the initial state to the time of interest, the power supply controller 2 is driven for a total of 1 hour in a state where the target temperature TEMP belongs to the temperature range R[1], the power supply controller 2 is driven for a total of 200 hours in a state where the target temperature TEMP belongs to the temperature range R[2], the power supply controller 2 is driven for a total of 10 hours in a state where the target temperature TEMP belongs to the temperature range R[3], the power supply controller 2 is driven for a total of 5 hours when the target temperature TEMP belongs to the temperature range R[4], and the power supply controller 2 is driven for a total of 1 hour when the target temperature TEMP belongs to the temperature range R[5]. Then, at the time of interest, the temperature history information indicating that the cumulative drive times $t_{ACM}[1]$, $t_{ACM}[2]$, $t_{ACM}[3]$, $t_{ACM}[4]$, and $t_{ACM}[5]$ are 1 hour, 200 hours, 10 hours, 5 hours, and 1 hour, respectively, is stored and held in the nonvolatile memory 26.

The signal output control circuit 28 can output the temperature history information stored in the nonvolatile memory 26 to the external device 5 via the communication bus described above. The external device 5 can transmit a command to the power supply controller 2 requesting the temperature history information, and the signal output control circuit 28 transmits the temperature history information to the external device 5 in response to receipt of the command by the power supply controller 2.

Additionally, the signal output control circuit 28 can output any information stored in the memory 26 or 27 (e.g., information corresponding to the detection result of each anomaly detected by the error detection circuit 24) to the external device 5 via the communication bus described above. In this case also, in response to receiving a predetermined command from the external device 5, the signal output control circuit 28 transmits information specified by the command (information in the memory 26 or 27) to the external device 5.

With the nonvolatile memory 26 holding the temperature history information as described above, it is possible to accumulate data on the operating environment of the power supply controller 2 even when the supply of the power supply voltage to the power supply controller 2 is frequently cut off. Thus, it is possible to determine the service life of the power supply controller 2. Further, causing the nonvolatile memory 26 to also hold the information related to anomalies facilitates subsequent failure analysis and the like (i.e., the information related to abnormalities can be useful for failure analysis and the like).

The signal output control circuit 28 may also perform service life determination processing. This will be explained now. In the service life determination processing, the signal output control circuit 28 determines whether the power supply controller 2 has reached the end of its service life based on the cumulative drive times $t_{ACM}[1]$ to $t_{ACM}[m]$ stored in the nonvolatile memory 26.

At the design stage of the power supply controller 2, a design value (hereinafter referred to as "serviceable design time") for the drive time during which the power supply controller 2 can continue to operate according to specifications is determined. However, the serviceable design time varies depending on the operating temperature of the power supply controller 2. Basically, the higher the operating temperature of the power supply controller 2, the shorter the serviceable design time. Considering this, in the service life determination process, the signal output control circuit 28 derives a weighted sum $W_{SUM}$ by performing weighted addition of the cumulative drive times $t_{ACM}[1]$ to $t_{ACM}[m]$, and makes a determination related to the service life of the power supply controller 2 by comparing the weighted sum $W_{SUM}$ and a predetermined service life determination threshold. The power supply controller 2 is closer to the end of its service life as the weighted sum $W_{SUM}$ increases from zero.

The weighted sum $W_{SUM}$ is derived according to the following equation (1). In other words, the weighted sum $W_{SUM}$ is the sum of first to m-th products. The j-th product is $(k[j] \times t_{ACM}[j])$. k[1] to k[m] are each predetermined coefficients. The coefficients k[1] to k[m] are all different from each other. However, the values of some of the coefficients k[1] to k[m] can be the same as the values of some of the other coefficients. The coefficients k[1] to k[m] include at least two or more coefficients with different values. For example, at least the coefficients k[1] and k[m] have different values from each other. As mentioned above, the higher the operating temperature of the power supply controller 2, the shorter the serviceable design time. Therefore, basically, the value of the coefficient k[j+1] should be greater than the value of the coefficient k[j] (at least "k[m]>k[1]").

$$W_{SUM} = \sum_{j=1}^{m} (k[j] \times t_{ACM}[j]) \tag{1}$$

In the service life determination processing, the signal output control circuit 28 compares the weighted sum $W_{SUM}$ with a predetermined service life determination threshold $TH_{LIM}$. The signal output control circuit 28 determines that the power supply controller 2 has reached the end of its service life when the weighted sum $W_{SUM}$ is equal to or greater than the service life determination threshold $TH_{LIM}$, and does not determine that the power supply controller 2 has reached the end of its service life when the weighted sum $W_{SUM}$ is less than the service life determination threshold $TH_{LIM}$. The signal output control circuit 28 decides whether to output (transmit) a predetermined service life arrival signal to the external device 5 based on the result of determining whether the power supply controller 2 has reached the end of its service life. In a case where the signal output control circuit 28 determines that the power supply controller 2 has reached the end of its service life, the signal output control circuit 28 outputs (transmits) the predetermined service life arrival signal to the external device 5. In a case where the signal output control circuit 28 does not determine that the power supply controller 2 has reached the end of its service life, the signal output control circuit 28 does not output (transmit) the service life arrival signal.

In the service life determination processing, the signal output control circuit 28 compares the weighted sum $W_{SUM}$ with each of a predetermined service life warning threshold $TH_W$ and the service life determination threshold $TH_{LIM}$, and may output (transmit) a predetermined service life warning signal to the external device 5 when "$TH_{LIM}>W_{SUM}\geq TH_W$" is satisfied. The service life arrival signal is a signal indicating that the power supply controller 2 has reached the end of its service life, whereas the service life warning signal is a signal indicating that the power supply controller 2 will soon reach the end of its service life. By enabling output of the service life arrival signal or the service life warning signal, the user can know when to replace the power supply controller 2 or equipment including the power supply controller 2.

The service life arrival information and the service life warning information can be stored in each of the memories 26 and 27. The service life arrival information and the service life warning information each have a value of "1" or "0." The initial value of each of the service life arrival information and the service life warning information is "0." When "$W_{SUM}\geq TH_W$" is satisfied, the signal output control circuit 28 writes "1" to the service life warning information in the memories 26 and 27 via the memory controller 25. When "$W_{SUM}\geq TH_{LIM}$" is satisfied, the signal output control circuit 28 writes "1" to the service life arrival information in the memories 26 and 27 via the memory controller 25. The service life warning information having a value of "1" indicates that the power supply controller 2 will soon reach the end of its service life. The service life arrival information having a value of "1" indicates that the power supply controller 2 has reached the end of its service life.

The service life arrival signal and the service life warning signal may be in a form distinguishable from each other by the external device 5. Alternatively, the following signal output configuration may be adopted. A signal output circuit with an open drain configuration is provided in the power supply controller 2, and the signal output circuit is configured to output an error signal from the power supply controller 2 to the external device 5. The error signal is a binarized signal representing a value of "1" or "0." In principle, the signal output control circuit 28 gives the error signal the value "0" and outputs an error signal having a value of "1" when "$W_{SUM}\geq TH_{LIM}$" is satisfied. In this case, the error signal having a value of "1" functions as the service life arrival signal. Alternatively, in principle, the signal output control circuit 28 gives the error signal the value "0" and outputs an error signal having a value of "1" when "$W_{SUM}\geq TH_W$" is satisfied. In this case, the error signal having a value of "1" functions as the service life warning signal. In addition, the signal output control circuit 28 also outputs an error signal having a value of "1" when a specific anomaly (e.g., temperature anomaly or output voltage anomaly) is detected by the anomaly detection circuit 24. In this case, the external device 5 cannot determine the cause of the "1" error signal in detail at the stage of receiving the "1" error signal. However, after receiving the "1" error signal, the external device 5 transmits a command to the power supply controller 2 requesting the storage information in the memory 26 or 27. Upon receiving the information sent by the power supply controller 2 in response to the command (storage information in the memory 26 or 27), the external device 5 can determine the cause of the "1" error signal in detail. Note that, when the power supply controller 2 receives the predetermined error reset command from the external device 5, the value of the error signal may be reset to "0" by the power supply controller 2.

Application and Modifications

Some applications or modifications of the above-mentioned embodiments are described below.

The memory controller 25 may be configured to store the temperature history information including time series data of the target temperature TEMP in the nonvolatile memory 26. In other words, for example, consider a case where the power supply controller 2 is driven for a total of 3 hours in a state where the target temperature TEMP belongs to the temperature range R[1], and then the power supply controller 2 is driven for a total of 10 hours in a state where the target temperature TEMP belongs to the temperature range R[2]. In this case, time series data that can identify that the power supply controller 2 was driven for a total of 10 hours in a state where the target temperature TEMP belongs to the temperature range R[2] after the power supply controller 2 was driven for a total of 3 hours in a state where the target temperature TEMP belongs to the temperature range R[1] can be stored in the nonvolatile memory 26.

A plurality of the temperature sensors 21 may be provided in the power supply controller 2. In this case, the plurality of temperature sensors 21 are installed at a plurality of mutually different measurement target positions in the power supply controller 2, and the temperatures at the plurality of measurement target positions are individually detected by the plurality of temperature sensors 21. The temperatures at the plurality of measurement target positions are the plurality of target temperatures TEMP. In this case, the temperature history information can be stored in the nonvolatile memory 26 for each target temperature TEMP by performing each of the operations described above for each target temperature TEMP.

The total number of regulators 4 in the power supply apparatus 1 may be one. That is, "n=1" is also acceptable.

The power supply apparatus 1 may be installed in a vehicle, such as an automobile. In this case, the input voltage $V_{IN}$ input to the power supply apparatus 1 and the power supply voltage of the power supply controller 2 are the output voltage of a battery installed in the vehicle, or are generated based on the output voltage of the battery. However, the power supply apparatus 1 is not limited to being applied to a vehicle and no limitation is intended.

The channel types of the FETs (field-effect transistors) described in the embodiments are examples. The channel type of any FET may be changed between the P-channel type and the N-channel type in a manner that does not detract from the main purpose described above.

As long as no contradictions arise, any of the transistors described above can be any type of transistor. For example, any transistor described above as a MOSFET can be replaced by a junction FET, an insulated gate bipolar transistor (IGBT) or a bipolar transistor, provided that no contradictions arise. Any of the transistors has a first electrode, a second electrode, and a control electrode. In the case of a FET, one of the first and second electrodes is the drain and the other is the source, and the control electrode is the gate. In the case of an IGBT, one of the first and second electrodes is the collector and the other the emitter, and the control electrode is the gate. In bipolar transistors not belonging to IGBTs, one of the first and second electrodes is the collector and the other is the emitter, and the control electrode is the base.

The embodiments of the present disclosure may be modified in various ways as appropriate within the scope of the technical ideas indicated in the claims. The above embodiments are only examples of embodiments of the present disclosure, and the meaning of the terms in the present disclosure and each component requirement is not limited to those described in the above embodiments. The specific numerical values shown in the above description are merely examples, and as a matter of course, they can be changed to various values.

Supplementary Notes

Supplementary notes are provided for the present disclosure, of which specific configuration examples are shown in the embodiments above.

A power supply controller according to an aspect of the present disclosure is a power supply controller (2) configured to control operation of a power supply apparatus (1) that generates an output voltage (VOLT) from an input voltage ($V_{IN}$), the power supply controller (2) including a temperature determination circuit (22) configured to determine to which of a plurality of temperature ranges (R[1] to R[m]) a temperature (TEMP) of the power supply controller belongs, a measurement circuit (23) configured to measure, for each of the plurality of temperature ranges, a period for which the temperature of the power supply controller belongs to the temperature range, and a nonvolatile memory (26) configured to store a measurement result of the measurement circuit (first configuration).

With this configuration, it is possible to accumulate data on the operating environment of the power supply controller even when the supply of power supply voltage to the power supply controller is frequently cut off, and also makes it possible to make decisions related to the service life of the power supply controller.

In the power supply controller according to the first configuration described above, the nonvolatile memory stores a cumulative drive time ($t_{ACM}$[1] to $t_{ACM}$[m]) for each of the plurality of temperature ranges, and the cumulative drive time ($t_{ACM}$[j]) for each of the plurality of temperature ranges may represent a cumulative value of the period for which the temperature of the power supply controller belongs to the temperature range (R[j]) in a period for which the power supply controller is driven (second configuration).

The power supply controller according to the second configuration described above may further include a signal output control circuit (28) configured to output a specific signal (e.g., the service life arrival signal) to an external device (5) of the power supply controller, in which the signal output control circuit may be configured to decide whether to output the specific signal based on each of the cumulative drive times stored in the nonvolatile memory (third configuration).

In the power supply controller according to the third configuration described above, the signal output control circuit may be configured to decide whether the power supply controller has reached an end of its service life based on each of the cumulative drive times stored in the nonvolatile memory, and may decide whether to output the specific signal based on a result of the determination (fourth configuration).

With this configuration, it is possible to notify an external device that the power supply controller has reached the end of its service life.

In the power supply controller according to the fourth configuration described above, the signal output control circuit may be configured to derive a weighted sum ($W_{SUM}$) by performing weighted addition on a plurality of the cumulative drive times for the plurality of temperature ranges, and may determine whether the power supply controller has reached the end of its service life based on a result of comparison between the weighted sum and a predetermined threshold value (fifth configuration).

With this configuration, whether the power supply controller has reached the end of its service life can be estimated satisfactorily.

The power supply controller according to any of the first to fifth configurations described above may further include a temperature sensor (21) configured to output a signal ($S_{TEMP}$) corresponding to the temperature of the power supply controller, and a temperature anomaly detection circuit (24a) configured to detect a temperature anomaly of the power supply controller based on an output signal of the temperature sensor, in which the temperature determination circuit determines to which of the plurality of temperature ranges the temperature of the power supply controller belongs by using the temperature sensor (sixth configuration).

With this configuration, the temperature sensor provided for detecting a temperature anomaly can also be used to perform temperature classification and other operations for storing information in the nonvolatile memory.

The power supply controller according to any of the first to fifth configurations described above may also include an anomaly detection circuit (24) configured to detect a predetermined anomaly, and when the anomaly detection circuit detects the anomaly, information indicating that the anomaly is detected may be stored in the nonvolatile memory (seventh configuration).

With this configuration, subsequent failure analysis and the like (i.e., information related to an anomaly can be used for failure analysis and the like) is easier.

In the power supply controller according to any of the first to seventh configurations described above, the power supply apparatus may include regulators (4) for a plurality of channels and generate the output voltage from the input voltage for each of the channels, and the power supply controller may control operation of each of the regulators for each of the channels (eighth configuration).

What is claimed is:

1. A power supply controller configured to control operation of a power supply apparatus that generates an output voltage from an input voltage, the power supply controller comprising:

a temperature determination circuit configured to determine to which of a plurality of temperature ranges a temperature of the power supply controller belongs;

a measurement circuit configured to measure, for each temperature range of the plurality of temperature ranges, a period for which the temperature of the power supply controller belongs to the temperature range;

a nonvolatile memory configured to store a measurement result of the measurement circuit; and a memory controller configured to control writing to the nonvolatile memory, wherein the measurement circuit is configured to output, for each temperature range of the plurality of temperature ranges, a count-up signal to the memory controller each time a predetermined unit of time elapses while the temperature of the power supply controller belongs to one of the plurality of temperature ranges, and the memory controller is configured to, in response to receiving the count-up signal, update a cumulative drive time corresponding to the one of the plurality of temperature ranges stored in the nonvolatile memory.

2. The power supply controller according to claim 1, wherein the nonvolatile memory stores a cumulative drive time for each of the plurality of temperature ranges, and the cumulative drive time for each of the plurality of temperature ranges represents a cumulative value of the period for which the temperature of the power supply controller belongs to the temperature range in a period for which the power supply controller is driven.

3. The power supply controller according to claim 2, further comprising a signal output control circuit operable to output a specific signal to an external device of the power supply controller, wherein the signal output control circuit decides whether to output the specific signal based on each of the cumulative drive times stored in the nonvolatile memory.

4. The power supply controller according to claim 3, wherein the signal output control circuit determines whether the power supply controller has reached an end of its service life based on each of the cumulative drive times stored in the nonvolatile memory, and decides whether to output the specific signal based on a result of the determination.

5. The power supply controller according to claim 4, wherein the signal output control circuit derives a weighted sum by performing weighted addition on a plurality of the cumulative drive times for the plurality of temperature ranges, and determines whether the power supply controller has reached the end of its service life based on a result of comparison between the weighted sum and a predetermined threshold value.

6. The power supply controller according to claim 1, further comprising a temperature sensor configured to output a signal corresponding to the temperature of the power supply controller; and a temperature anomaly detection circuit configured to detect a temperature anomaly of the power supply controller based on an output signal of the temperature sensor, wherein the temperature determination circuit determines to which of the plurality of temperature ranges the temperature of the power supply controller belongs by using the temperature sensor.

7. The power supply controller according to claim 1, further comprising an anomaly detection circuit configured to detect a predetermined anomaly, wherein when the anomaly detection circuit detects the anomaly, information indicating that the anomaly is detected is stored in the nonvolatile memory.

8. The power supply controller according to claim 1, wherein the power supply apparatus includes regulators for a plurality of channels and generates the output voltage from the input voltage for each of the channels, and the power supply controller controls operation of each of the regulators for each of the channels.

9. The power supply controller according to claim 1, wherein the temperature determination circuit is configured to output to the measurement circuit a classification signal indicating to which of the plurality of temperature ranges the temperature of the power supply controller belongs.

* * * * *